United States Patent
Wang et al.

[11] Patent Number: 6,033,234
[45] Date of Patent: Mar. 7, 2000

[54] PRINTED CIRCUIT BOARD TO FLEXIBLE PRINTED CIRCUIT CONNECTION SYSTEM

[75] Inventors: Terry Shing Wang, Irvine; John Steven Szalay, Corona Del Mar, both of Calif.

[73] Assignee: Packard Hughes Interconnect Company, Irvine, Calif.

[21] Appl. No.: 09/026,110

[22] Filed: Feb. 19, 1998

[51] Int. Cl.⁷ ........................................................ H01R 9/09
[52] U.S. Cl. .................................. 439/67; 439/77; 439/493
[58] Field of Search ................................ 439/67, 77, 492, 439/493, 632, 326

[56] References Cited

U.S. PATENT DOCUMENTS

| | | | |
|---|---|---|---|
| 3,221,286 | 11/1965 | Fedde | 439/74 |
| 4,548,451 | 10/1985 | Benarr et al. | 439/66 |
| 5,207,887 | 5/1993 | Crumly et al. | 205/78 |

*Primary Examiner*—Lincoln Donovan
*Assistant Examiner*—Hae Moon Hyeon
*Attorney, Agent, or Firm*—Patrick M. Griffin

[57] ABSTRACT

A connection system requiring little or no force to mechanically and electrically connect a printed circuit board to a flexible printed circuit. The connection system includes a flat and rigid carrier having an upper surface upon which is affixed a flexible printed circuit having an electrically conductive raised area in the form of a plurality of raised dots. At the upper surface, the carrier has a groove formed therein, wherein the raised dots are located in the groove. An elastomeric insert is situated in the groove in abutting relation to the flexible printed circuit behind the raised dots. A rigid printed circuit board has an electrically conductive area in the form of a plurality of pads. The printed circuit board is inserted into the groove, whereupon the elastomer resiliently compresses so as to press the plurality of raised dots into tight electrical contact with the plurality of pads. In a first preferred embodiment the printed circuit board is inserted vertically with slight force. In a second preferred embodiment, the printed circuit board is inserted at an acute angle with zero insertion force and then rotated to the vertical.

5 Claims, 2 Drawing Sheets

PRINTED CIRCUIT BOARD TO FLEXIBLE PRINTED CIRCUIT CONNECTION SYSTEM

TECHNICAL FIELD

The present invention relates to systems for connecting a printed circuit board to a flexible printed circuit. More particularly, the present invention relates to systems of the aforesaid type, wherein zero insertion force or little insertion force are involved in making the connection.

BACKGROUND OF THE INVENTION

Printed circuit boards have become ubiquitous in electronic devices for providing a compact and reliable base for electronic components. Printed circuit boards are generally formed of a rigid dielectric layer having a plurality of holes for receiving leads of electronic components, and on one side of the dielectric layer, a predetermined pattern of an electrical conductor (typically copper) for being soldered to the leads and conduct current as desired. It is also known to provide printed circuits which have a flexible dielectric layer, known a flexible printed circuit.

In order to function as a part of an electrical circuit of a device, printed circuit boards and flexible printed circuits must often be electrically connected together. Typically, this is accomplished via electrical connectors.

It is known to provide electrical connection between printed circuit boards and flexible printed circuits using mutual abutment of electrically conductive raised dots and pads. While the mutual touching of raised dots and pads provides an excellent alternative to electrical connectors, there remains in the art the problem of mechanically connecting the printed circuit board and the flexible printed circuit so as to ensure an electrical connection, wherein the raised dots and pads remain in good electrical contact, without requiring excessive force to effect the mechanical connection. This is important, in that the application of force to ensure proper mechanical seating of the printed circuit board with respect to the flexible printed circuit can result in damage to one or both.

Accordingly, what is needed in the art is a system to provide connection of a printed circuit board to a flexible printed circuit with little or no force being required to effect electrical contact between the raised dots and pads thereof.

SUMMARY OF THE INVENTION

The present invention is a connection system requiring little or no force to mechanically and electrically connect a printed circuit board to a flexible printed circuit. In this regard, the printed circuit board provides a high mechanical leverage to resiliently compress an elastomeric insert which resides in a carrier for the flexible printed circuit, wherein little or no insertion force is required. The resilient compression of the insert returns an equal and opposite force that mates the pads of the printed circuit board to the raised dots of the flexible printed circuit.

The connection system according to the present invention includes a flat and rigid carrier (or backplane). Upon an upper surface of the carrier is affixed a flexible printed circuit having an electrically conductive raised area in the form of a plurality of raised dots. At the upper surface, the carrier has a groove formed therein, wherein the raised dots are located in the groove. An elastomeric insert is situated in the groove in abutting relation to the flexible printed circuit behind the raised dots. A rigid printed circuit board has an electrically conductive area in the form of a plurality of pads. The printed circuit board is inserted into the groove, whereupon the elastomer resiliently compresses so as to press the plurality of raised dots into tight electrical contact with the plurality of pads.

In a first preferred embodiment of the connection system according to the present invention, little insertion force is required. The elastomer is generally C-shaped (or U-shaped), having a bottom wall and mutually facing sidewalls (or arms). In the relaxed state of the insert, the sidewalls have a gap therebetween which is less than the thickness of the printed circuit board. The flexible printed circuit is preferably initially humped over the groove. The printed circuit board is inserted vertically downward into the groove by being pressed between the sidewalls, wherein the flexible printed circuit follows the printed circuit board therein. A lubricant on the sidewalls may be used to aid insertion of the printed circuit board. Upon resting at the bottom wall of the slot, the plurality of raised dots are pressed against the plurality of pads by the resiliency of the elastomer.

In a second preferred embodiment of the connection system according to the present invention, zero insertion force is required. A housing is inserted into the groove, wherein the housing is generally U-shaped, having a bottom wall and mutually opposing sidewalls. One sidewall is chamfered and the other sidewall holds an elastomer having a lumped protrusion facing the chamfered sidewall. The plurality of raised dots of the flexible printed circuit are situated in the groove facing the chamfered sidewall, wherein the lumped protrusion rests therebehind. The printed circuit board is inserted into the groove by being slid adjacent to, and at the acute angle of, the chamfer until mechanically stopped by the bottom wall. Then the printed circuit board is rotated to a vertical position, whereat clips associated with the carrier hold the printed circuit board at the vertical position. At this position, the plurality of raised dots are pressed against the plurality of pads by the resiliency of the elastomer.

Accordingly, it is an object of the present invention to provide a connection system for mechanically connecting a printed circuit board to a flexible printed circuit with zero or little insertion force being required.

It is another object of the present invention to provide a connection system between a printed circuit board and a flexible printed circuit, wherein zero or little mechanical force is needed to effect insertion, and wherein raised dots on the flexible printed circuit are brought into resiliently biased electrical contact with pads of the printed circuit board.

These, and additional objects, advantages, features and benefits of the present invention will become apparent from the following specification.

DESCRIPTION OF THE PREFERRED EMBODIMENT

Figure 1:
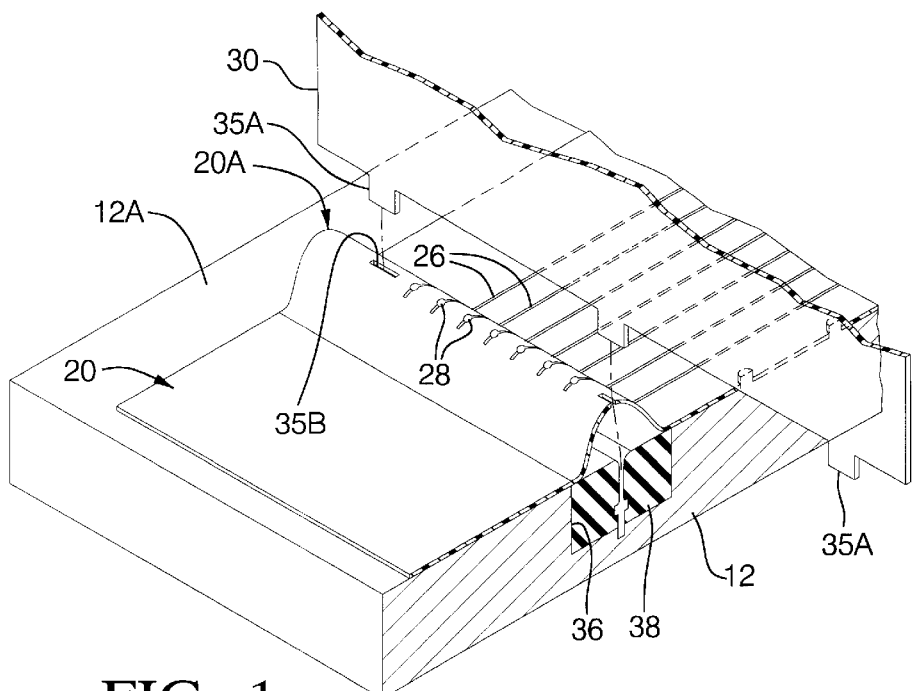
FIG. 1 is a broken-away, partly sectional perspective view of a connection system according to a first preferred embodiment of the present invention, shown just prior to insertion.
Figure 2:
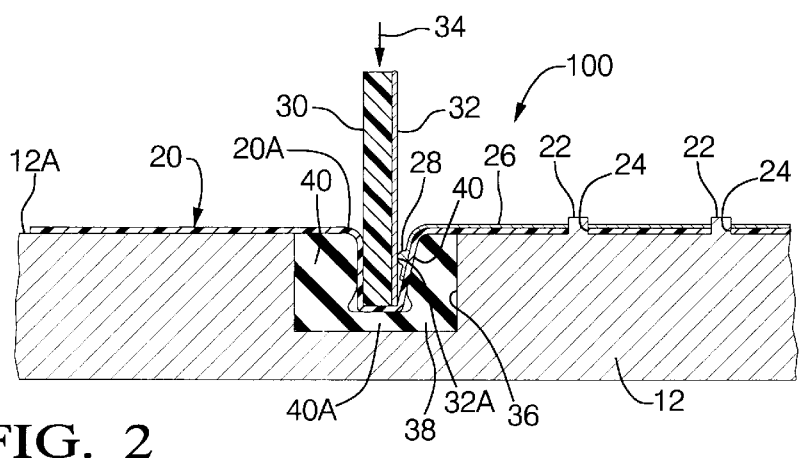
FIG. 2 is a sectional side view of the connection system according to the first preferred embodiment of the present invention, shown after insertion.
Figure 3:
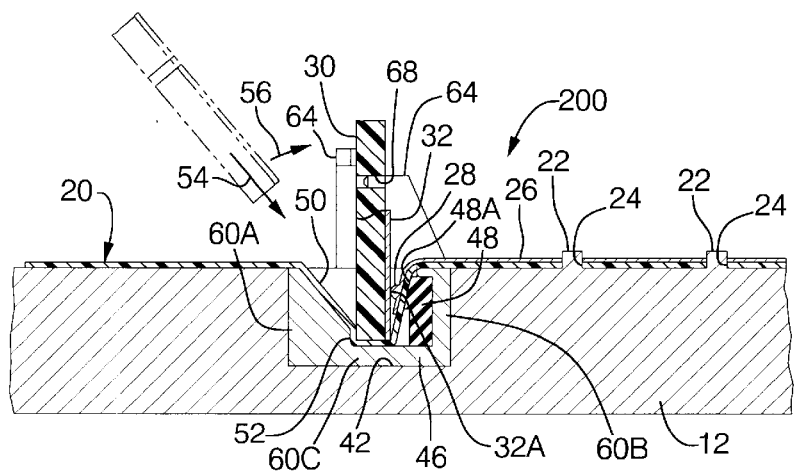
FIG. 3 is a sectional side view of a connection system according to a second preferred embodiment of the present invention, shown after insertion.
Figure 4:
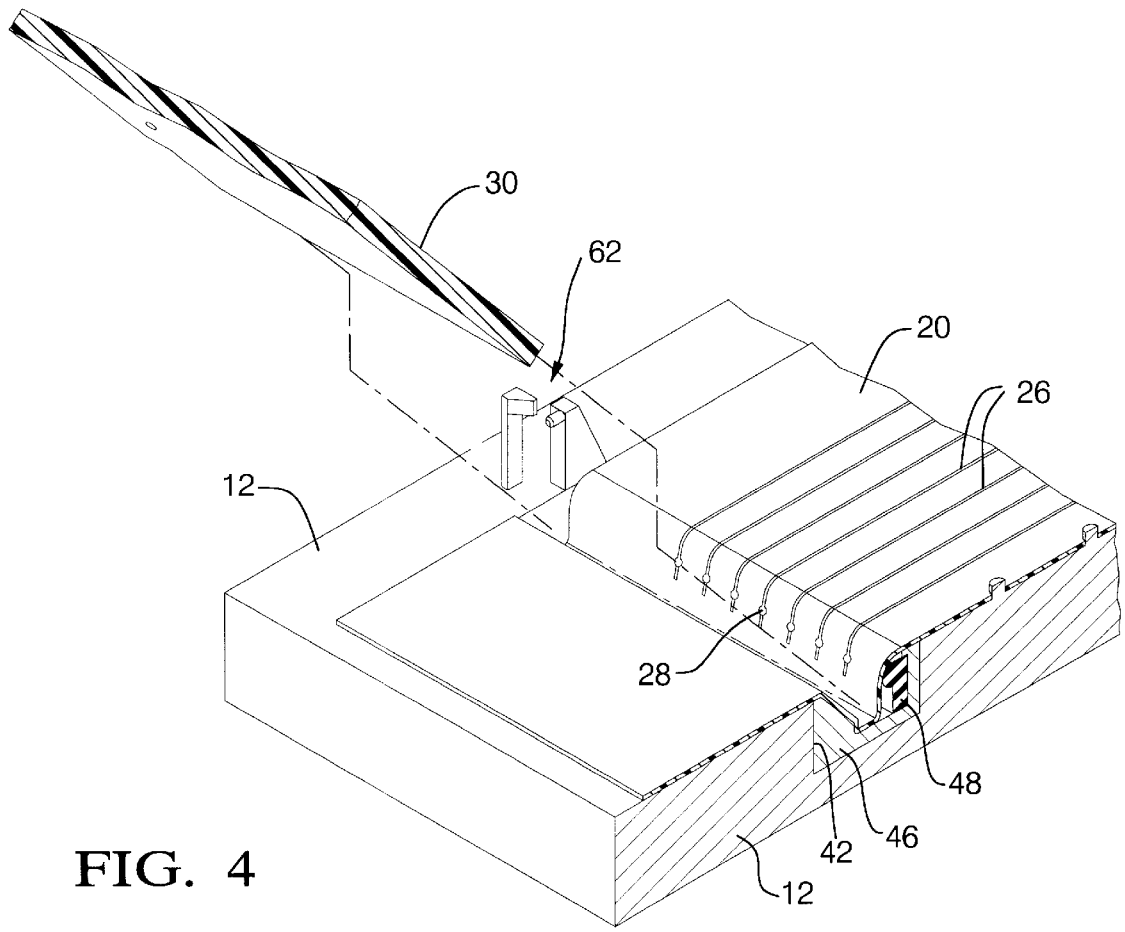
FIG. 4 is a broken-away, partly sectional perspective view of the connection system according to the second embodiment of the present invention, shown just prior to insertion.
Figure 5:
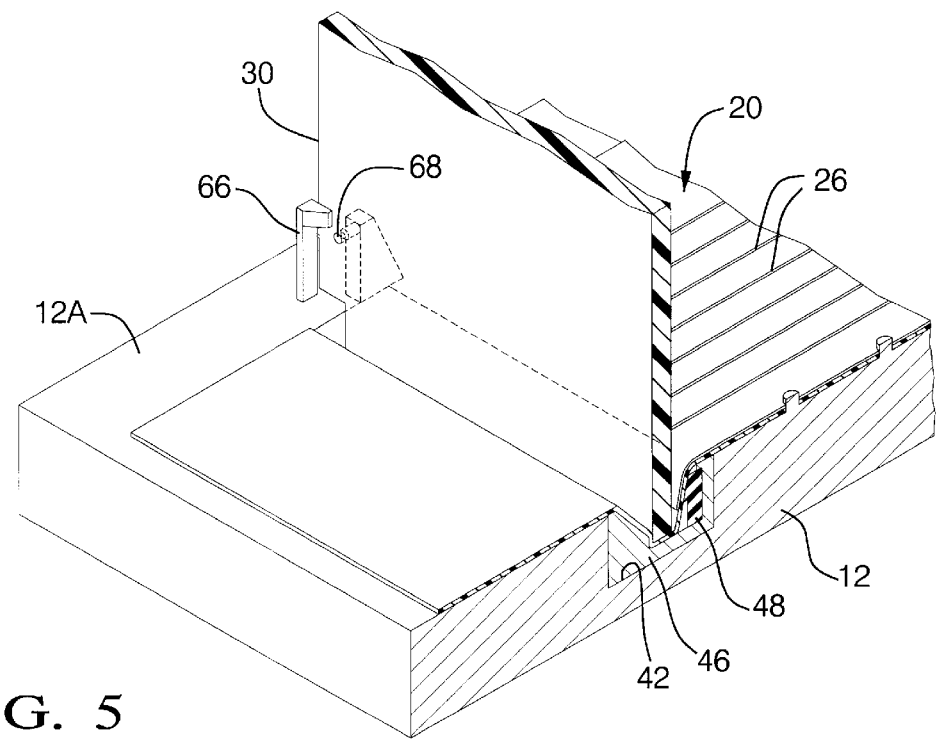
FIG. 5 is a broken-away, partly sectional perspective view of the connection system according to the second embodiment of the present invention, shown after insertion.

Referring now to the Drawings, FIGS. 1 and 2 depict a first embodiment of the connection system 100 according to the present invention, wherein little insertion force is utilized. Remaining FIGS. 3 through 5 depict a second embodiment of the connection system 200 according to the present invention, wherein zero insertion force is utilized.

Referring firstly to FIGS. 1 and 2, the structure and function of the first embodiment of the connection system 100 will be described.

A substantially planar, rigid carrier 12 is provided, composed of a dielectric material, preferably a plastic. A flexible printed circuit 20 is positioned on an upperside 12a of the carrier 12. The flexible printed circuit 20 is held in place on the upperside 12a by any suitable arrangement, such as for example a plurality of spaced pins 22 of the carrier 12 passing through respective apertures 24 of the flexible printed circuit.

The flexible printed circuit 20 has electrically conductive lines 26 which electrically connect with an electrically conductive raised area 28, preferably in the form of a plurality of raised gold dots or dimples. The flexible printed circuit 20 is connected, via the connection system, with a printed circuit board 30 having electrically conductive lines 32 which electrically connect with an electrically conductive area 32a preferably in the form of a plurality of pads. In this regard, the connection system is intended to electrically connect the plurality of raised dots with the plurality of pads.

A substantially rectangularly cross-sectioned groove 36 is formed at an upper side 12a of the carrier 12. An elastomeric insert 38 is affixedly positioned in the groove 36. The insert 38 has a substantially U-shaped (or C-shaped) cross-section characterized by a bottom wall 40a and mutually opposing sidewalls 40. In the relaxed state of the insert 38 (that is, when the printed circuit board is not inserted into the groove), the sidewalls 40 have a predetermined gap therebetween which is narrower than the thickness of the printed circuit board 30, and preferably have an enlarged gap adjacent the bottom wall 40a.

Preferably, an insertable portion 20a of the flexible printed circuit 20 lies in a humped over configuration outside the groove 36, such that when the insertable portion is inserted into the groove 36 it is able to generally follow the contour of the sidewalls 40 and bottom wall 40a. Humping over of the insertable portion 20a of the flexible printed circuit 20 has advantages which will be discussed below.

In order to align the printed circuit board 30 with the flexible printed circuit 20 so that the plurality of raised dots align with the plurality of pads, a guide therebetween is provided. In this regard, the bottom edge of the printed circuit board has a plurality of spaced apart tabs 35a which insert into a plurality of respective slots 35b formed in the insertable portion 20a of the flexible printed circuit 20 prior to insertion into the groove.

In operation, a user grasps the printed circuit board 30 and first aligns the printed circuit board with the flexible printed circuit by placing the tabs 35a into the slots 35b. Then the printed circuit board is gently pressed into the groove 36 along arrow 34, whereduring the sidewalls 40 are resiliently compressed by the printed circuit board and accompanying insertable portion 20a of the flexible printed circuit 20. Upon reaching abutting the bottom wall 40a, the plurality of raised dots are respectively aligned with the plurality of pads. The resilient compression of the insert at its sidewalls results in the plurality of raised dots being pressed into electrically good contact with the plurality of pads.

An advantage of humping over the insertable portion 20a of the flexible printed circuit 20 besides allowing for alignment with the printed circuit board 30 prior to insertion into the groove 36, is that the printed circuit board will interface with the plurality of raised dots of the raised electrically conductive area 28 without sliding movement therebetween. Accordingly, the chance that the plurality of raised dots to be injured by abrasion from the printed circuit board during insertion into the groove is essentially eliminated. In order to ease the simultaneous insertion of the printed circuit board 30 and insertable portion 20a into the groove 36 slidably in relation to the sidewalls 40, a lubricant may be placed upon the sidewalls.

To remove the printed circuit board from the groove, the user need only pull upwardly thereupon opposite to the direction indicated by arrow 34.

Finally with respect to the first embodiment of the connection system 100, it is to be understood that the electrically conductive area 32a of the printed circuit board 30 may be on both sides (rather than just one side as shown). In such a case, the raised electrically conductive area 28 of the insertable portion 20a is then in the form of two spaced apart areas which are located to contact the electrically conductive area 32a of the printed circuit board 30 when seated in the groove 36. Further in such a case, the elastomeric insert 38 has a pair of lumped protrusions, one for each of the raised electrically conductive areas of the flexible printed circuit.

Referring now to FIGS. 3 through 5, the structure and function of the second embodiment of the connection system 200 will be described, wherein like functioning parts are given like numeral designations to that used for the first embodiment of the connection system 100 shown at FIGS. 1 and 2, and for which redundant descriptions thereof is omitted for the sake of brevity.

A rectangularly shaped groove 42 is formed in the upperside 12a of the carrier 12. A housing 46 is affixedly positioned in the groove 42. The housing 46 is preferably composed of a rigid plastic material. The housing 46 is generally U-shaped, having a pair of opposed first and second sidewalls 60a, 60b and a bottom wall 60c. The first sidewall 60a is provided with a chamfered surface 50 and an upright face 52 adjacent the bottom wall 60c. The second sidewall 60b has a U-shape which traps therein an elastomeric insert 48. The elastomeric insert 48 has a lumped protrusion 48a which faces toward the chamfered surface 50. The insertable portion 20a of the flexible circuit 20 is located in the groove, wherein it generally conforms with respect to the insert 48, bottom wall 60c and sidewall 60a. The raised area 28 of the insertable portion 20a is located at the lumped protrusion 48a and faces toward the chamfered surface 50.

In operation, a user grasps the printed circuit board 30, angles it generally into the plane of the chamfered surface 50, and then inserts the bottom edge thereof along arrow 54 into the slot adjacent to, and at the acute angle of, the chamfered surface until mechanically stopped by the bottom wall 60c. Then the printed circuit board is rotated along arrow 56 to a vertical position, whereat clips 62 associated with the carrier 12 hold, with an audible click sound, the printed circuit board at the vertical position. Preferably, the clips 62 are in the form of dowels 64 and resilient arms 66, wherein the dowels are received into respective holes 68 in the printed circuit board 30. At this position, the lumped protrusion 48a of the elastomeric insert 48 is compressed by the printed circuit board 30 due to cooperative holding action thereof by the upright face 52 and the clips 62. Accordingly, the plurality of raised dots are pressed against the plurality of pads by the resiliency of the elastomer thereby providing an electrically good contact therebetween.

To release the printed circuit board with respect to the groove, the arms are resiliently deformed to allow the printed circuit board to be tilted into the plane of the chamfered surface and then slid outwardly therealong.

The connection system 100, 200 according to the present invention, therefore, provides a mechanical and electrical connection between a printed circuit board and a flexible printed circuit without need for an electrical connector. Further, the present invention has particular application in providing the edge connection between the flexible printed circuit and the switch or control cards of an electrical distribution system, the description of which being incorporated by reference in corresponding Great Britain Patent Application No. 9718893.2, filed on Sep. 8, 1997, which is hereby incorporated by reference.

To those skilled in the art to which this invention appertains, the above described preferred embodiments may be subject to change or modification. Such change or modification can be carried out without departing from the scope of the invention, which is intended to be limited only by the scope of the appended claims.

We claim:

1. A connection system, comprising:
   a flexible printed circuit having a raised first electrically conductive area;
   a printed circuit board having a second electrically conductive area;
   a substantially rigid carrier having an upper surface, said upper surface having a groove formed therein;
   securing means for retaining said flexible printed circuit board at the upper surface so that said first electrically conductive area is insertable into said groove; and
   pressing means located in said groove for resiliently pressing said first electrically conductive area into electrical contact with said second electrically conductive area when said printed circuit board is placed into said groove;
   wherein said pressing means comprises a substantially U-shaped elastomeric insert located in said groove, said insert comprising a pair of opposing sidewalls and a bottom wall, wherein said opposing sidewalls are resiliently compressed when said printed circuit board is placed into said groove so as to provide said resilient pressing; and
   wherein said flexible printed circuit has an insertable portion that is insertable into said groove, said insertable portion having said first electrically conductive area, said insertable portion lying in a humped over configuration above said groove prior to said printed circuit board being inserted into said groove, wherein said insertable portion inserts into said groove simultaneously with said printed circuit board as said printed circuit board is inserted into said groove.

2. The connection system of claim 1, wherein said raised first electrically conductive area comprises a plurality of raised gold dots.

3. A method for connecting a flexible printed circuit having a raised first electrically conductive area to a printed circuit board having a second electrically conductive area, said method comprising the steps of:
   laying a raised first electrically conductive area of a flexible printed circuit in a humped over configuration above a groove; and
   pressing a second electrically conductive area of a printed circuit board into the groove wherein said raised first electrically conductive area is thereby caused by the printed circuit board into the groove inserted into the groove with the second electrically conductive area;
   wherein during said step of pressing, the second electrically conductive area is resiliently pressed against the first electrically conductive area.

4. A zero insertion force connection system, comprising:
   a flexible printed circuit having a raised first electrically conductive area;
   a printed circuit board having a second electrically conductive area;
   a substantially rigid carrier having an upper surface, said upper surface having a groove formed therein;
   a housing located in said groove, said housing having a first sidewall, a second sidewall opposing said first sidewall, and a bottom wall, wherein said first sidewall has a chamfered surface and an upright face adjacent said bottom wall, said second sidewall having a U-shape;
   an elastomeric insert trapped in the U-shape of said second sidewall, said elastomeric insert having a lumped protrusion located remote from said bottom wall facing toward said chamfered surface;
   securing means for retaining said flexible printed circuit at said upper surface, wherein a portion of flexible printed circuit conformingly contacts said chamfered surface, said upright face, said bottom wall and said lumped protrusion so as to provide a space for inserting said second electrically conductive area of said printed circuit board into said groove, and wherein said first electrically area is located at said lumped portion facing toward said chamfered surface; and
   holding means connected with said carrier for retaining said printed circuit board substantially perpendicular to said upper surface when said second electrically conductive area is inserted into said groove;
   wherein said second electrically conductive area of said printed circuit board is inserted into said groove parallel to said chamfered surface and thereupon rotated away from said chamfered surface toward said lumped portion, whereupon said holding means and said upright face cooperatively act on said printed circuit board to compress said elastomeric insert to thereby resiliently press said first electrically conductive area into contact with said second conductive area.

5. The zero insertion force connection system of claim 4, wherein said raised first electrically conductive area comprises a plurality of raised gold dots.

* * * * *